United States Patent [19]

Sako

[11] Patent Number: 4,984,065
[45] Date of Patent: Jan. 8, 1991

[54] HYBRID RESIN-SEALED SEMICONDUCTOR DEVICE

[75] Inventor: Shigeki Sako, Yokohama, Japan

[73] Assignee: Kabushiki Kaisha Toshiba, Kawasaki, Japan

[21] Appl. No.: 459,318

[22] Filed: Dec. 29, 1989

[30] Foreign Application Priority Data

Jan. 11, 1989 [JP] Japan ................................. 1-4051

[51] Int. Cl.⁵ ..................... H01L 23/36; H01L 23/40; H01L 23/48
[52] U.S. Cl. .......................................... 357/81; 357/75; 357/70
[58] Field of Search .................. 357/68, 75, 80, 74, 357/70, 81

[56] References Cited

U.S. PATENT DOCUMENTS

| 3,784,884 | 1/1974 | Zoroglu | 357/75 |
| 4,200,880 | 4/1980 | Frey | 357/80 |
| 4,739,389 | 4/1988 | Goedbloed | 357/74 |

FOREIGN PATENT DOCUMENTS

| 58-213456 | 12/1983 | Japan | 357/75 |
| 63-141328 | 6/1988 | Japan | 357/75 |
| 63-250164 | 10/1988 | Japan | 357/75 |

Primary Examiner—Rolf Hille
Assistant Examiner—S. V. Clark
Attorney, Agent, or Firm—Oblon, Spivak, McClelland, Maier and Neustadt

[57] ABSTRACT

A hybrid semiconductor device comprises a heat sink on which a plurality of semiconductor chips are mounted, an insulating substrate secured to the heat sink, conductive metallic layers formed on the insulating substrate, electrodes formed on the semiconductor chips, first thin metallic wires for connecting the electrodes and the conductive metallic layers together, conductive intermediate members integrally formed with the heat sink and located higher than the heat sink, second thin metallic wires for connecting the conductive intermediate members to points to which the first thin metallic wires are connected, and a molding member for sealing and securing the above-mentioned elements. With the above structure, jumpers are arranged in such a manner as not to short-circuit to the conductive metallic layers and other conductive members. Moreover, the hybrid semiconductor device can be manufactured at a low cost since its manufacturing process can reduce the number of steps.

4 Claims, 3 Drawing Sheets

HYBRID RESIN-SEALED SEMICONDUCTOR DEVICE

BACKGROUND OF THE INVENTION

1. Field of the Invention

The present invention relates to a hybrid resin-sealed semiconductor device for use as a power device, and more particularly to a hybrid resin-sealed semiconductor device wherein wires extending from a plurality of semiconductor chips mounted on a heat sink can intersect one another without causing any problem.

2. Description of the Related Art

A Hybrid resin-sealed semiconductor device, wherein a coil or other structural components are not monolithically formed on a semiconductor chip, is known as one type of semiconductor device. It is commercially available and is used in various technical fields. In the case where the hybrid resin-sealed semiconductor device comprises a power element requiring a large amount of power, a lead frame made up mainly of a heat sink is used as a casing. Normally, a pair of semiconductor devices of the same type are mounted on the heat sink. In some cases, however, a power integrated circuit device such as a power IC or a Darlington circuit device and a general semiconductor device such as an MOS IC, a bipolar IC, or a logic device are mounted on the heat sink in combination.

Figure 1A:
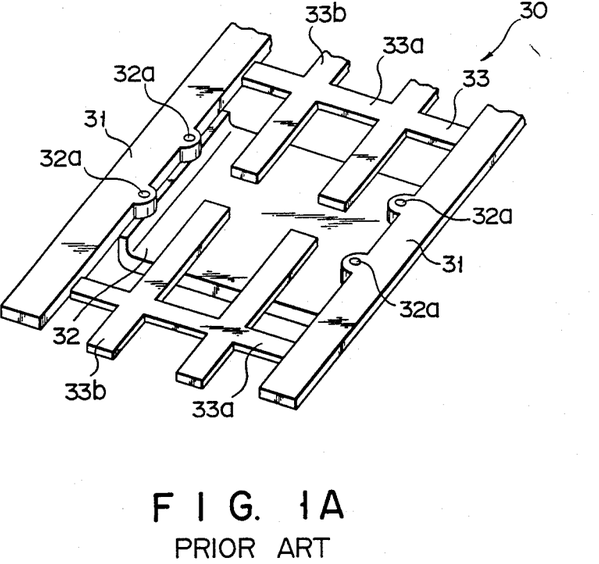
FIG. 1A is a perspective view of a lead frame for use with a conventional power device.
Figure 1B:
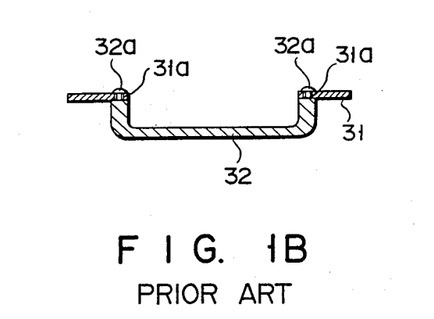
FIG. 1B is a sectional view of the lead frame.

FIG. 1A is a perspective view of a lead frame 30 used for fabricating a conventional hybrid resin-sealed semiconductor device. The lead frame 30 is obtained by pressing a conductive metallic plate. The specific construction of the lead frame 30 is as follows:

A plurality of heat sinks 32 are provided between a pair of first frames 31 arranged in parallel to each other. A plurality of second frames 33a are also provided between the first frames 31 in such a manner that each second frame 33a is located between the adjacent heat sinks 32 and extends perpendicular to the first frames 31. Further, internal leads 33b are arranged perpendicular to the second frames 33a. One end of each internal lead 33b is free, while the other end is located above the region in the neighborhood of the center of the heat sink 32. Normally, the second frames 33a and the internal leads 33b are integrally formed as one body. As can be seen in FIG. 1A, the heat sinks 32 are located slightly lower than the first frames 31. A pair of projections 32a are formed on each side of the heat sink 32, and a pair of through-holes 31a are formed in each of the first frames 31. After fitting the projections 32a in the respective through-holes 31a, those through-holes 31a are crushed flat, thereby fixing the heat sink 32 and the first frames 32 together.

Figure 2:
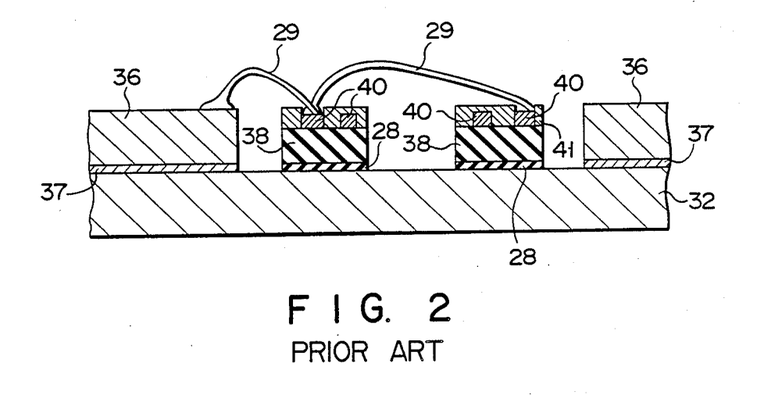
FIG. 2 is a sectional view of part of a conventional hybrid resin-sealed semiconductor device.
Figure 3:
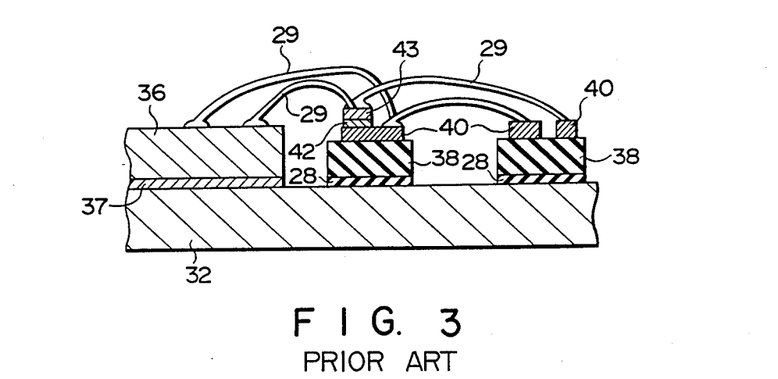
FIG. 3 is a sectional view of another conventional hybrid resin-sealed semiconductor device.

As is shown in FIG. 2, a pair of power ICs, that is, semiconductor chips 36 of the same type are mounted on the heat sink 32 in an ordinary manner (only one of the power ICs being shown in FIG. 2). Next, the pair of semiconductor chips 36 are secured to the heat sink 32 by use of an adhesive layer 37. Thereafter, the lead frame 30 is subjected to a bonding step. An active or passive region is formed in the power ICs 36 by doping the impurities. In the bonding step, at least one of the electrodes, wiring layers, and pads electrically connected to the active or passive region is connected to the internal lead 33b by means of a thin metallic wire 29. The electrodes, wiring layers, or pads are normally connected to external elements. Hereinafter, all portions, including the above three, that are subjected to bonding will be referred to simply as electrodes. In the bonding step, ordinary ball bonding or ultrasonic ball bonding is utilized. As is shown in FIGS. 2 and 3, the bonding first performed with respect to the thin metallic wire is ball bonding, and the bonding performed next is wedge bonding. The bonding with respect to the thin metallic wire is completed by performing these two kinds of bonding.

Since a hybrid resin-sealed semiconductor device includes various circuit components, a grounded point must be used in common to a plurality of power ICs, and the circuit components must be connected together in a predetermined fashion. As is shown in FIG. 2, therefore, a plurality of insulating substrates 38, formed of glass epoxy resin, are formed on the mounting positions on the heat sink 32. The insulating substrate 38 is secured to the heat sink 32 by use of the insulating adhesive material 28. The thin metallic wires 29 are used as jumpers. Prior to the bonding step, conductive coatings 40 are formed on the tops of insulating substrates 38 by deposition, and insulating layers 41 are provided for the prevention of a short circuit. In addition, as shown in FIG. 3, interlayer insulating film 42 is formed on about a half of the surface of each conductive coating 40 which is formed on insulating substrate 38. A second conductive layer 43 may be formed on the interlayer insulating film 42, for the connection between electrodes of the power ICs 36 if it is necessary. The distance between the insulating substrate 38 and the power IC 36 must be at least 0.2 mm. In the case where two insulating substrates 38 are formed, they are spaced from each other by at least 0.5 mm, and thin metallic wires 29 formed of Al, Au or Cu and having a diameter in the range between 25 μm and 50 μm are employed. An insulating protection film (not shown) is formed on both the conductive coatings 40 and the second conductive layer 43, so as to prevent coatings 40 and layer 43 from undesirably short-circuiting to other thin metallic wires 29.

With respect to the lead frame 30 fabricated as above, a normal resin sealing step is performed by use of the transfer mold process. Thereafter, the lead frame 30 is subjected to a cut and bend step to thus complete a semiconductor device.

As may be understood from the above, if the wires extending from the circuit portions on the insulating substrates intersect one another, a short circuit may be caused. To solve this problem, the following measures have been conventionally adopted: (1) to arrange the wires three-dimensionally by employing an insulating substrate comprising a conductive multi layer; and (2) to use the thin metallic wires as jumpers. However, measure (1) results in a high manufacturing cost since conductive layers have to be formed as a laminated structure. Measure (2) also results in a high manufacturing cost, due to an increase in the number of steps required. More specifically, if jumpers 29 are arranged over two conductive coatings 40, as is shown in FIG. 2, the wires have to be coated with an insulating protection material, so as to prevent a short circuit between the jumpers 29 and the conductive coatings 40 at the time of the resin sealing step.

SUMMARY OF THE INVENTION

The present invention has been developed in consideration of the above circumstances, and is intended to provide a hybrid resin-sealed semiconductor device which is simple in structure and requires neither a conductive multi layer formed within an insulating layer nor an insulating protection layer coated on the wires, and which enables intersection of wires without causing any short circuit.

To achieve this object, the hybrid resin-sealed semiconductor device comprises: a heat sink on which a plurality of semiconductor chips are mounted; an insulating substrate secured to the heat sink; conductive metallic layers formed on the insulating substrate; electrodes formed on the semiconductor chips; first thin metallic wires for connecting the electrodes and the conductive metallic layers together; conductive intermediate members integrally formed with the heat sink and located higher than the heat sink; second thin metallic wires for connecting the conductive intermediate member to points to which the first thin metallic wires are connected; and a molding member for sealing and securing the above-mentioned elements.

In the present invention, the heat sink which is part of a casing and internal leads ar different in level. By utilizing this level difference, the internal lead is used as a member for intermediating thin metallic wires in the bonding step. As a result, even if the thin metallic wires connecting the conductive metallic layers coated on the insulating substrate and the electrodes formed on the semiconductor elements intersect each other, they do not short-circuit since they are located at different levels. Moreover, since no insulating layer has to be formed on the conductive metallic layer located on the insulating substrate, the manufacturing cost of the device is not high.

DETAILED DESCRIPTION OF THE PREFERRED EMBODIMENTS

One embodiment of the present invention will now be described with reference to FIGS. 4 and 5.

A hybrid integrated circuit device employing a power IC 2 is incorporated in a lead frame which comprises a heat sink 1, as in the prior art. After subjected to a resin-sealing step, a cut and bend step, etc., the hybrid integrated circuit device is completed. The lead frame provided with the heat sink used in the present invention is similar to that explained above with reference to FIGS. 1 to 3. However, the present invention differs from the prior art, in that a lead frame located at a different level from that of the heat sink is utilized as an intermediating member for intermediating thin metallic wires.

The present invention will now be described in more detail.

Figure 4:
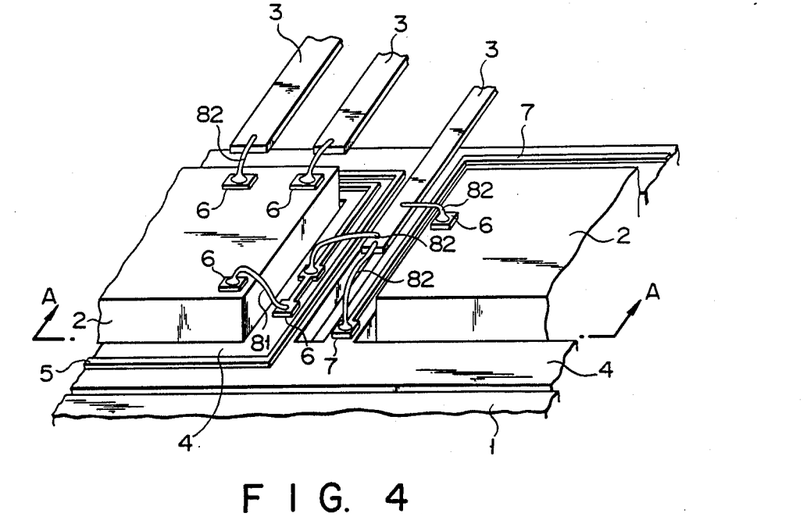
FIG. 4 is a perspective view of a part of a hybrid resin-sealed semiconductor device according to an embodiment of the present invention, the semiconductor device illustrated in FIG. 4 being in an unmolded state.

FIG. 4 is a perspective view of the hybrid resin-sealed integrated circuit device according to the present invention. The integrated circuit device shown in FIG. 4 is in an unmolded state and includes a plurality of power ICs 2 which are mounted on the heat sink 1 in an ordinary manner. The heat sink 1 used in the present invention is of a depressed type, such as that shown in FIGS. 1A and 1B. The lead frame is obtained by pressing a conductive metallic plate, and comprises: a pair of first frames 31 arranged in parallel to each other; a plurality of heat sinks 1 which are provided between the first frames so as to connect them and on which semiconductor devices are mounted; a plurality of second frames 3a provided between the first frames 31 in such a manner that each second frame is located between the adjacent heat sinks 1 so as to connect the first frames 31; and internal leads 3 arranged such that one end is fixed to the second frame and the other end is a free end located above the substantial center of the heat sink. The internal lead 3 is located higher than the heat sink 1. As is shown in FIG. 4, a plurality of silicon power ICs 2 are secured on the heat sink 1 in an ordinary fashion by use of either a conductive adhesive or an Au-Si eutectic material An insulating substrate 4 formed of glass epoxy resin is arranged such that it surrounds the power ICs 2. A conductive metallic layer 5 is formed on the insulating substrate 4 by patterning, such that the conductive metallic layer surrounds one of the power ICs 2.

Figure 5:
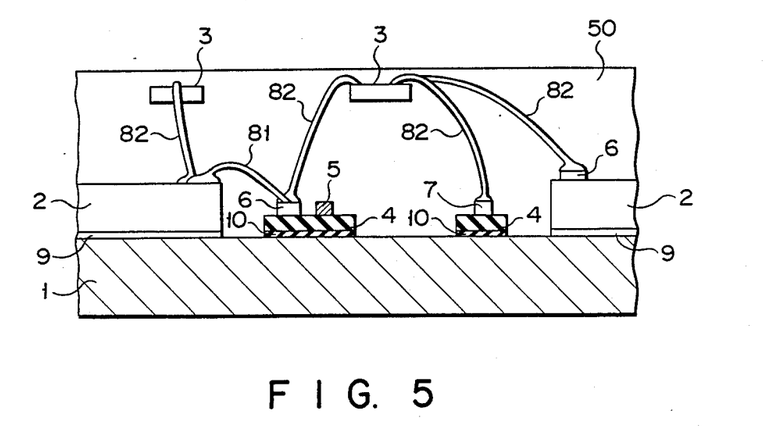
FIG. 5 is an enlarged sectional view taken along line A—A in FIG. 4, the semiconductor device illustrated in FIG. 5 being in a molded state.

FIG. 5 is a sectional view taken along line A—A in FIG. 4 and illustrates a hybrid resin-sealed semiconductor device obtained after molding. As is shown in FIG. 5, the silicon power ICs 2 are mounted on, and secured to the heat sink 1 by use of the conductive adhesive layer 9 including the solder The insulating substrate 4 is located between the silicon power ICs 2 and is secured to the heat sink 1 by use of the insulating adhesive material 10. The conductive metallic layer 6 is formed on the top of the insulating substrate 4. The distance between the silicon power IC 2 and the insulating substrate 4 is not less than 0.2 mm, and the distance between the insulating substrates 4 is not less than 0.5 mm.

With the power ICs 2 mounted in the above manner, an electrode 6 of one silicon power IC 2 is connected to the conductive metallic layer 5 by providing a first thin metallic wire 81, while the internal lead 3 i.e., the intermediating member 3 is connected to electrodes 6 of the other power ICs 2 and the conductive metallic layer 7 by providing second thin metallic wires 82. The first and second thin metallic wires are formed of Au, Al, Cu or another conductive metal, and have diameters in the range between 25 $\mu$m and 50 $\mu$m. The bonding first performed with respect to the thin metallic wires 81 and 82 is either ultrasonic or ordinary ball bonding, and the bonding performed next is wedge bonding. This bonding step is carried out by use of an ordinary bonding device. After performing the first bonding i.e., the ball bonding, the bonding arm of the bonding device is lifted and moved until it comes to a location where the second bonding should be performed. Therefore, the thin metallic wires 81 and 82 are extended between two different levels corresponding to the locus for which the bonding arm is moved, and therefore they form substantially triangular loops.

In the hybrid semiconductor device fabricated in the manner mentioned above, the thin metallic wires 82 are extended between different levels, and therefore do not touch the electrodes 6 and 7 and conductive metallic layer if the wires 82 intersect the electrodes 6 and 7 and the layer 5. Even if the thin metallic wires 82 are pushed down in the resin-sealing step, it is not likely that the thin metallic wires 82 will touch the electrodes 6, 7 and the conductive metallic layer 5. In the above description, reference was made to the case where a pair of power ICs 2 of the same type are mounted on the heat sink 1. Needless to say, however, three or more power devices of different types may be mounted on the heat sink. Finally, molding is performed by use of thermosetting resin 50, such as epoxy resin, so as to secure and seal each portion of the semiconductor device.

In the hybrid semiconductor device of the present invention, jumpers are arranged in such a manner that they do not short-circuit to one another. In addition, the semiconductor device can be manufactured without requiring a large number of steps. Therefore, the semiconductor device can be manufactured at a low cost. Moreover, since the portions to which the thin metallic wires are connected are located at different levels, the thin metallic wires are hard to short-circuit to one another even if they are exerted with a external mechanical force. If the thin metallic wires are exerted with an extremely large external force, they will be broken, so that the semiconductor device will be detected as being defective.

What is claimed is:

1. A hybrid resin-sealed semiconductor device, comprising:
   a heat sink on which a plurality of semiconductor chips are mounted;
   an insulating substrate secured to the heat sink;
   conductive metallic layers formed on the insulating substrate;
   electrodes formed on the semiconductor chips;
   first thin metallic wires for connecting the electrodes and the conductive metallic layers together;
   conductive intermediate members integrally formed with the heat sink and located higher than the heat sink;
   second thin metallic wires for connecting the conductive intermediate member to points to which the first thin metallic wires are connected; and
   a molding member for sealing and securing the above-mentioned elements.

2. A hybrid resin-sealed semiconductor device according to claim 1, wherein said first and second thin metallic wires are formed of Au, Al or Cu.

3. A hybrid resin-sealed semiconductor device according to claim 1, wherein said first and second thin metallic wires are subjected to ultrasonic ball bonding step.

4. A hybrid resin-sealed semiconductor device according to claim 1, wherein said first and second thin metallic wires are subjected to wedge bonding step.

* * * * *

UNITED STATES PATENT AND TRADEMARK OFFICE
CERTIFICATE OF CORRECTION

PATENT NO. : 4,984,065

DATED : February 24, 1992

INVENTOR(S) : Shigeki Sako

It is certified that error appears in the above-identified patent and that said Letters Patent is hereby corrected as shown below:

The sheets of drawings consisting of Figures 1-5, should be deleted to be replaced with the attached Figures 1-5.

Signed and Sealed this

Twenty-fifth Day of May, 1993

Attest:

MICHAEL K. KIRK

Attesting Officer

Acting Commissioner of Patents and Trademarks